(12) United States Patent
Teranuma et al.

(10) Patent No.: US 6,373,116 B1
(45) Date of Patent: Apr. 16, 2002

(54) TWO-DIMENSIONAL IMAGE DETECTOR

(75) Inventors: Osamu Teranuma, Tenri; Yoshihiro Izumi, Kashihara, both of (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/631,967

(22) Filed: Aug. 3, 2000

(30) Foreign Application Priority Data

Aug. 4, 1999 (JP) ............................................. 11-221160
Jun. 1, 2000 (JP) ........................................ 2000-165136

(51) Int. Cl.[7] ............................................... H01L 27/00
(52) U.S. Cl. ....................................................... 257/428
(58) Field of Search ............................ 257/53, 57, 59, 257/72, 428, 431, 435, 443, 444, 452; 250/370.01, 370.08, 370.09, 370.12

(56) References Cited

U.S. PATENT DOCUMENTS 5,598,004 A * 1/1997 Powell et al.
5,780,871 A * 7/1998 Den Boer et al.

OTHER PUBLICATIONS

"Similarities between TFT Arrays for Direct–Conversion X–Ray Sensors and High–Aperture AMLCDS" (W. den Boer et al., SID 98 Digest, pp 371–374, 1998).
09/542,485 filed Apr. 3, 2000.
09/520,609 filed Mar. 7, 2000.

* cited by examiner

Primary Examiner—Keith Christianson
(74) Attorney, Agent, or Firm—Nixon & Vanderhye, P.C.

(57) ABSTRACT

In a two-dimensional image detector in accordance with the present invention, an active matrix substrate includes:

a gate insulating film provided on gate electrodes and storage capacitance electrodes (Cs electrodes) provided in turn on a glass substrate;

a first insulating protection layer and a second insulating protection layer sequentially provided on the gate insulating film; and pixel electrodes provided on the second insulating protection layer in a matrix. The second insulating protection layer is made of an acrylic resin, and its edges are completely covered with the photoconductor film.

18 Claims, 9 Drawing Sheets

TWO-DIMENSIONAL IMAGE DETECTOR

FIELD OF THE INVENTION

The present invention relates to two-dimensional image detectors capable of detecting images by means of X-rays and other kind of radiation and visible, infrared, and other light.

BACKGROUND OF THE INVENTION

Conventionally known two-dimensional image detectors for detecting images of radiation, such as X-rays, or light, such as visible or infrared light, form an image by collecting and reading electric charges generated in a photosensitive semiconductor layer by means of pixels located on an active matrix substrate such as the one used in a conventional type of liquid crystal display device. For the purpose of increasing the per-pixel fill factor (aperture ratio), some conventional two-dimensional detectors have a so-called roof structure in which pixel electrodes are separated by an insulating layer from the address lines (electrode wires) and TFT elements that are provided in turn on the active matrix substrate.

More specific description of the structure can be found in Similarities between TFT Arrays for Direct-Conversion X-ray Sensors and High-Aperture AMLCDs, by W. den Boer, et al., SID 98 DIGEST, PP.371–374, 1998; and U.S. Pat. No. 5,780,871 (Date of patent: Jul. 14, 1998).

FIG. 9 is a cross-sectional view schematically showing an arrangement of a pixel in a two-dimensional image detector having a conventional roof-structured active matrix substrate.

As shown in FIG. 9, in the base structure of the two-dimensional image detector, there are provided a roof-structured active matrix substrate 101, a photoconductor film 102, and a common electrode 103, forming sequential layers in this order.

The roof-structured active matrix substrate 101 includes a glass substrate 104, a TFT (Thin Film Transistors) 105, an electric charge storage capacitance (Cs) 106, and a pixel electrode 107. The TFT 105 acts as a switching element. The pixel electrode 107 caps an insulating layer 115 which in turn covers the TFT 105 and the electric charge storage capacitance (Cs) 106.

The TFT 105 is constituted by a gate electrode 108, a gate insulating film 109, an a-Si film (i layer) 110, a-Si film (n⁺ layer) 111, a source electrode 112, and a drain electrode 113. The electric charge storage capacitance (Cs) 106 is constituted by a storage capacitance electrode (Cs electrode) 114, a gate insulating film 109, and a drain electrode 113 that also acts as a storage capacitance electrode forming a pair with the storage capacitance electrode (Cs electrode) 114.

The insulating layer 115 is interposed so as to electrically insulate the pixel electrode 107 from the electrode wires (the gate electrode 108 and the source electrode 112), the TFT 105, the electric charge storage capacitance (Cs) 106. The pixel electrode 107 and the drain electrode 113 are electrically connected in a contact hole 116 formed through the insulating layer 115.

The photoconductor film 102 is composed of a semiconductor material that generates electric charges (electrons, holes) when irradiated with radiation such as X-rays or light such as visible light.

Now, principles in the operation of the two-dimensional image detector will be discussed.

Electric charges (electrons, holes) are generated in the photoconductor film 102 when radiation such as X-rays or light such as visible light is projected to the photoconductor film 102 with voltage being applied across the common electrode 103 and the storage capacitance electrode (Cs electrode) 114. The generated electric charges move toward either the positive or negative electrode according to the sense of the apply voltage and are stored in the electric charge storage capacitance (Cs) 106. The electric charges stored in the electric charge storage capacitance (Cs) 106 are available for output through the source electrode 112 if the TFT 105 is changed to an open state by an input signal to the gate electrode 108.

The electrode wires (gate electrode 108 and source electrode 112), the TFT 105, and the electric charge storage capacitance (Cs) 106, when provided to form a X-Y matrix, are capable of scanning input signals to the gate electrodes 108 sequentially row by row and thereby obtain image information in two dimensions.

In two-dimensional image detectors including the aforementioned roof-structured active matrix substrate, an insulating layer is interposed between the pixel electrodes and the address lines (electrode wires) to provide insulation between them. FIG. 9 shows the insulating film 115 as an example of such an insulating layer. The insulating layer may be composed of a material such as, $SiO_x$, $SiN_x$, $Al_2O_3$, polyimide, or an acrylic resin; however, the level of insulation these materials offer varies from material to material for the following reasons.

Resin films can be formed using a spin coating, film lamination, or other similar technique. $SiO_x$ and $SiN_x$ films are costly, in comparison with resin films, due to the use of CVD (Chemical Vapor Deposition) in the manufacturing process. Resin films can be readily fabricated so as to make a flat surface on them using a spin coating technique, etc. By contrast, $SiO_x$ and $SiN_x$ films deposited using a CVD technique are inevitably affected by irregularities in the underlying layer, and will have a surface which is far from being flat in a satisfactory manner. In two-dimensional image detectors, irregularities in the surface of an insulating layer adversely affect the photoconductive layer deposited on the active matrix substrate, which undesirably degrades its detection performance. Thus, resins are the preferred material to form an insulating layer with a flat surface.

In two-dimensional image detectors, a parasitic capacitance appears where the address line (electrode wire) is placed on the top of on a pixel electrode, which is a major factor causing noise in signals. To reduce the signal noise, the parasitic capacitances should be reduced. A preferred insulating layer is therefore a thick one as long as other conditions allow. CVD techniques are hardly capable of forming a film thicker than 1 $\mu$m; by contrast, thick resin films are readily formed by spin coating. Further, a typical resin have a low dielectric constant, and allows reduction of the parasitic capacitances.

Further, contact holes should be provided in the insulating layer, in which the pixel electrodes are connected to the drain electrodes. The contact holes are formed using a photolithography technique. In view of these facts, the insulating film composed of an acrylic resin or other photosensitive material is convenient, because such an insulating film can be subjected to a photolithography process to form the contact holes, without applying and etching resist, and contributes to speedy processing in comparison with non-photosensitive materials.

For these reasons, the insulating layer is preferably made of an acrylic or other similar resin with a low dielectric constant and a satisfactory level of photosensitivity, and fabricated using a spin coating technique. To reduce the parasitic capacitances, the insulating layer is preferably made of a material with a low dielectric constant.

However, the following problems entail if a conventional two-dimensional image detector has a roof-structured active matrix substrate with an insulating layer made of the acrylic or other similar resin.

If the resin insulating layer included in a conventional roof-structured active matrix substrate is in direct contact with ambient air along the edges of a pixel area, degradation of the insulating layer material possibly greatly affects the reliability of the device. Specifically, we are concerned about ambient humidity among other factors, which is a likely cause to adversely affect the reliability. In general, acrylic and other similar resins are not durable in the presence of humidity; therefore, if composed of such a resin, the insulating layer peels off and inevitably degrades or otherwise changes in properties with time, starting where the insulating layer is in direct contact with ambient humidity. Acrylic and other similar resins have further problems that they are easy to polymerize, decompose or otherwise degrade due to irradiation by, for example, X-rays.

SUMMARY OF THE INVENTION

The present invention has an object to offer a highly reliable two-dimensional image detector, including a photoconductive semiconductor layer deposited on a roof-structured active matrix substrate, of which the insulating layer is protected from decay where it is in direct contact with ambient air along the edges of a pixel area so as to maintain its performance as a device.

In order to achieve the object, a two-dimensional image detector in accordance with the present invention includes:
  an active matrix substrate including pixel electrodes provided on an insulating layer provided in turn on;
    electrode wires arranged in a matrix;
    switching elements located at respective points in the matrix; and
    electric charge storage capacitances connected respectively to the electrode wires via the switching elements;
  a photoconductive semiconductor layer disposed on the active matrix substrate; and
  a protection film provided so as to cover edges of the insulating layer.

According to the arrangement, in the active matrix substrate, there is provided a protection film covering edges of the insulating layer interposed so as to electrically isolate the pixel electrodes from the electrode wires, the switching elements, and the electric charge storage capacitances; therefore, the edges of the insulating layer are not exposed, and the insulating layer is not exposed to external atmosphere. Consequently, even if the insulating layer is composed of, for example, an acrylic or other resin which is generally not durable in the presence of humidity, the insulating layer is prevented from peeling off, degrading, or otherwise changing in properties with time due to humidity and other adverse effects of ambient air starting where the insulating layer is exposed to ambient air, and also prevented from polymerizing, decomposing or otherwise degrading due to direct irradiation by, for example, X-rays.

This enables a satisfactory level of prevention of the deterioration of the material composing the insulating layer due to exposure of its exposed parts to external atmosphere and due to irradiation by, for example, X-rays during detection operation.

Alternatively, the semiconductor layer may double as the protection film.

A typical two-dimensional image detector includes a photoconductive semiconductor layer provided on an active matrix substrate. Electric charges (electrons, holes) are generated in a photoconductive semiconductor layer as it is irradiated by radiation or visual light. The electric charges (electrons, holes) are then collected in pixels on the active matrix substrate, and an image is formed from the readings. In the foregoing arrangement, a photoconductive semiconductor layer of the type used in a conventional two-dimensional image detector is provided so as to cover the edges of the insulating layer and doubles as a protection film to the insulating layer, which eliminates the need to provide a separate protection film for protecting the edges of the insulating layer.

This, without increasing the number of steps in manufacture, enables a satisfactory level of prevention of the deterioration of the material composing the insulating layer due to exposure of its exposed parts to external atmosphere and due to irradiation by, for example, X-rays during detection operation.

Preferably, on the semiconductor layer, there is additionally provided an electrode layer stretching only within the confines of the insulating layer.

Although the efficiency for the semiconductor layer to covert electric charges varies depending on the material, the semiconductor layer generally needs to be relatively thick to ensure a certain level of electric charge conversion efficiency. For example, an a-Se semiconductor layer needs to be 0.5 mm to 1.5 mm thick, in which case the electrode layer receives a voltage as high as a few kilovolts to tens of kilovolts.

In the foregoing arrangement in accordance with the present invention, no electrode layer is provided in an area where the insulating layer does not exist; therefore, the semiconductor layer, being provided in an area where the insulating layer does not exist, does not receive a high voltage from the electrode layer. Consequently, the insulating film typically provided on the electrode wires where the insulating layer does not exist does not need to provide isolation from any high voltage. This enables the prevention of isolation breakdown on the electrode wires and generation of parasitic capacitances in the insulating film disposed on the electrode wires. Thus, signal noise is reduced, and the reliability of the device is improved.

Further, the protection film may be composed of a resin.

In the arrangement, the protection film for protecting the edges of the insulating layer is composed of a resin; therefore a thick protection film is readily formed. In addition, the protection film is preferably insulating. Since a typical resin has a low dielectric constant, a protection film, if composed of such a resin, has a reduced dielectric constant.

This readily ensures a satisfactory level of prevention of the deterioration of the material composing the insulating layer due to exposure of its exposed parts to external atmosphere and due to irradiation by, for example, X-rays during detection operation.

Alternatively, in order to achieve the object, another two-dimensional image detector in accordance with the present invention includes:
  an active matrix substrate including pixel electrodes provided on an insulating layer provided in turn on:
    electrode wires arranged in a matrix;
    switching elements located at respective points in the matrix; and
    electric charge storage capacitances connected respectively to the electrode wires via the switching elements; and a shield member for shielding the insulating layer from external atmosphere.

According to the arrangement, in the active matrix substrate, there is provided a shield member for shielding, from external atmosphere, the insulating layer interposed so as to electrically isolate the pixel electrodes from the electrode wires, the switching elements, and the electric charge storage capacitances; therefore, the insulating layer is not exposed to external atmosphere. Consequently, even if the insulating layer is composed of, for example, an acrylic or other resin which is generally not durable in the presence of humidity, the insulating layer is prevented from peeling off, degrading, or otherwise changing in properties with time due to humidity and other adverse effects of ambient air, starting where the insulating layer is exposed to ambient air, and also prevented from polymerizing, decomposing or otherwise degrading due to direct irradiation by, for example, X-rays.

This enables a satisfactory level of prevention of the deterioration of the material composing the insulating layer due to exposure of its exposed parts to external atmosphere and due to irradiation by, for example, X-rays during detection operation.

Preferably, the shield member maintains the insulating layer in either one of inert gas, dry gas, and depressurized atmospheres so as to provide shield to the insulating layer from external atmosphere.

According to the arrangement, the insulating layer is maintained in either one of inert gas, dry gas, and depressurized atmospheres. It is therefore ensured that the insulating layer, especially the exposed parts, is shielded from humid external atmosphere.

This enables a satisfactory level of prevention of peeling of the insulating layer and deterioration of the material due to humidity.

Preferably, in each arrangement above, the insulating layer is composed of a resin.

According to the arrangement, the insulating layer, being composed of a resin, can be formed by a spin coating, film lamination, or other similar technique; therefore, the insulating layer can be readily formed with a flat surface and an increased thickness. Since a typical resin has a low dielectric constant, the insulating layer, if composed of such a resin, has a reduced dielectric constant.

Thus, a satisfactory level of prevention of poor detection performance, reduction in parasitic capacitances, and less likelihood of signal noise generation are imparted to two-dimensional image detectors at low costs.

The present invention will become more fully understood from the detailed description given hereinbelow and the accompanying drawings which are given by way of illustration only, are not in any way intended to limit the scope of the claims of the present invention.

DESCRIPTION OF THE EMBODIMENTS

[Embodiment 1]

Referring to FIG. 1 to FIG. 4, the following description will discuss a first embodiment in accordance with the present invention.

A two-dimensional image detector of the present embodiment is an X-ray-sensitive two-dimensional image detector.

Figure 1:
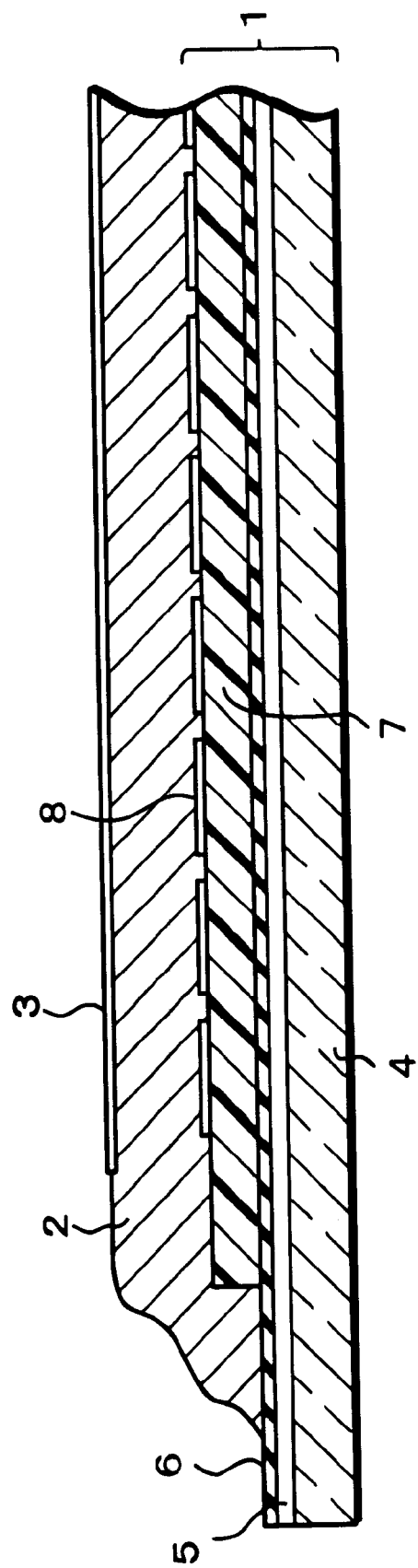
FIG. 1 is a cross-sectional view schematically showing an arrangement of an edge of a two-dimensional image detector in accordance with a first embodiment of the present invention.
Figure 2:
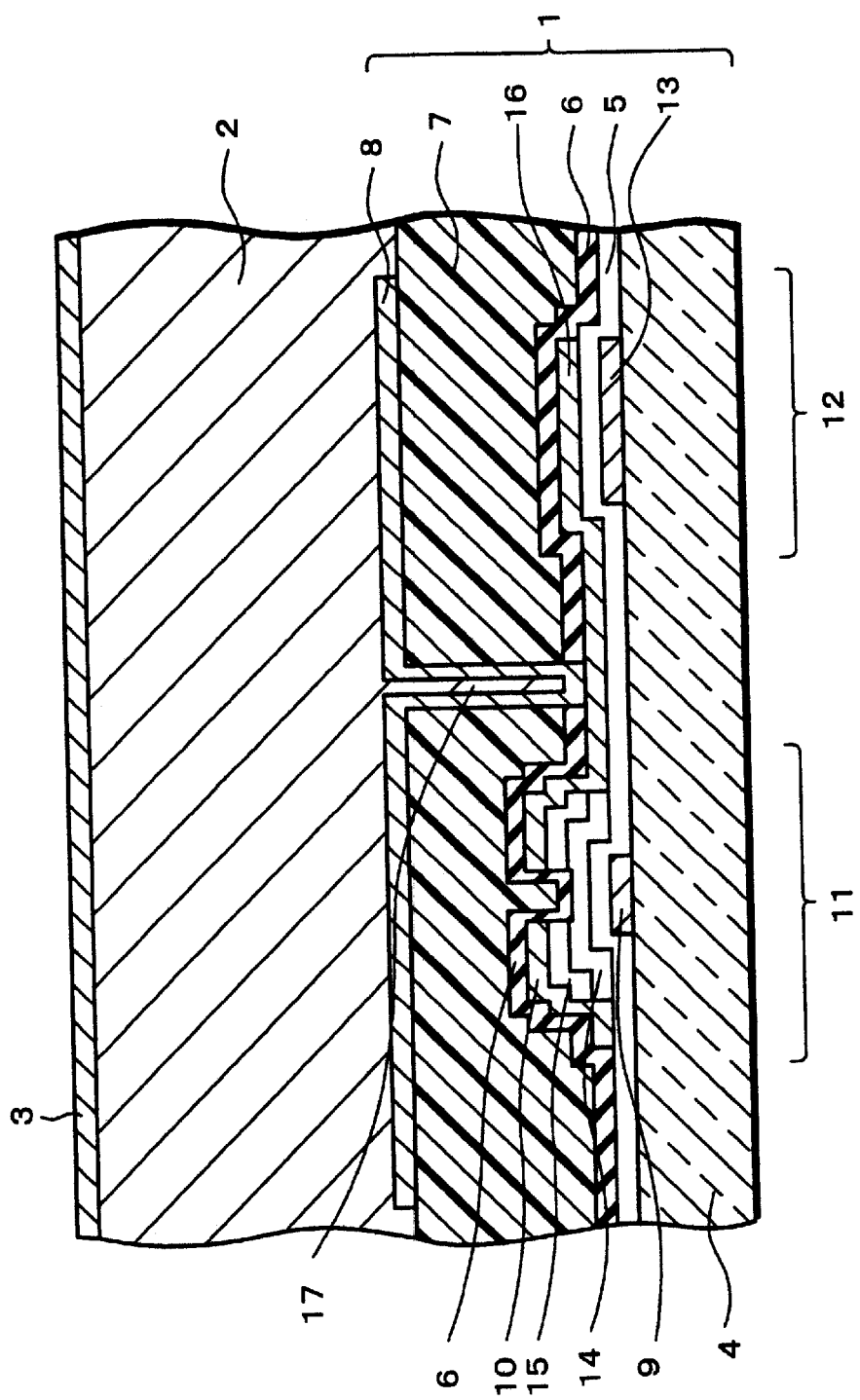
FIG. 2 is a cross-sectional view showing an arrangement of a pixel in the two-dimensional image detector.
Figure 3A:
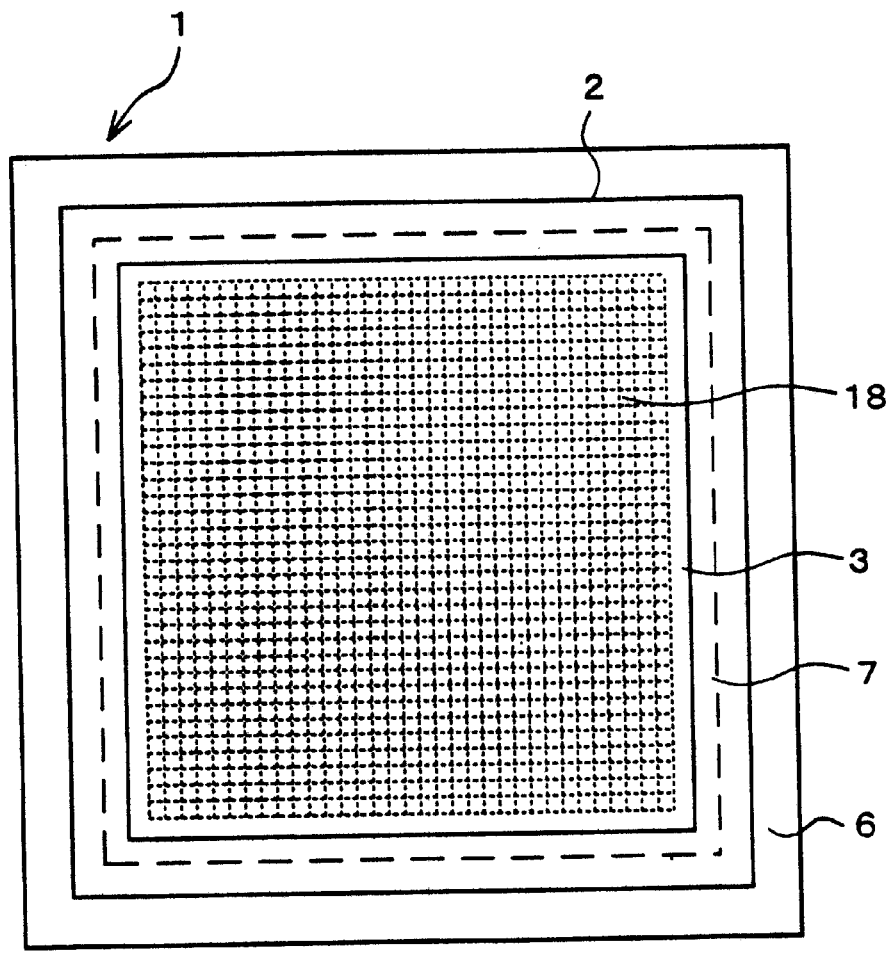
FIG. 3 is plan and cross-sectional views schematically showing relative positions of vertically stacked layers in the two-dimensional image detector.
Figure 3B:
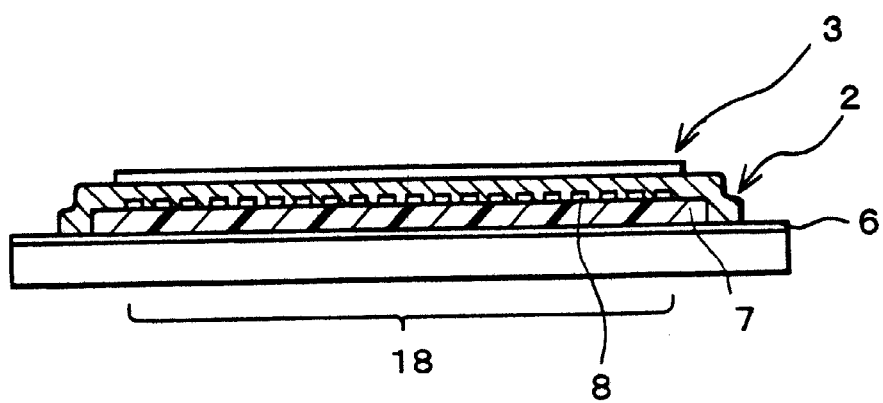

FIG. 1 is a cross-sectional view showing a base arrangement of the two-dimensional image detector of the present embodiment. FIG. 2 is a cross-sectional view showing an arrangement of a pixel of the two-dimensional image detector. FIG. 3 is plan and cross-sectional views schematically showing the relative positions of vertically stacked layers (detailed later) in the two-dimensional image detector.

As shown in FIG. 1, the base portion of the two-dimensional image detector of the present embodiment as a device includes an active matrix substrate 1, as well as a photoconductor film (semiconductor layer) 2 and common electrodes (electrode layer) 3 formed on the active matrix substrate 1. The active matrix substrate 1 includes a gate insulating film 5, a first insulating protection layer 6, a second insulating protection layer (insulating layer) 7, and pixel electrodes 8. The gate insulating film 5 is formed on a substantial entirety of a glass substrate 4 which acts as a support substrate for supporting later-mentioned gate electrodes (electrode wires, not shown) and storage capacitance electrodes (Cs electrodes, not shown). The first insulating protection layer 6 is formed on the gate insulating film 5. The second insulating protection layer 7 is formed on the first insulating protection layer 6. The pixel electrodes 8 provide a layer in which pixels are arranged in a matrix on the second insulating protection layer 7.

The photoconductor film 2 is formed on a substantial entirety of the active matrix substrate 1 and completely covers the edges of the second insulating protection layer 7, i.e., the boundary of the pixel area (display area) of the second insulating protection layer 7.

The common electrodes 3 are formed on a substantial entirety of the photoconductor film 2, but stretch only within the confines of the second insulating protection layer 7. In other words, the common electrodes 3 are formed within an area where the second insulating protection layer 7 is provided.

In the two-dimensional image detector of the present embodiment, each pixel electrode 8 is a square measuring 130 μm by 130 μm, and is separated from adjacent pixel electrodes by a distance of 150 μg. The pixel area (display area) as a whole is a square measuring 430mm by 430 mm.

Referring to FIG. 2, the following description will discuss an arrangement of the two-dimensional image detector of the present embodiment in detail.

Electrode wires (gate electrodes 9 and source electrodes 10) are provided in an X-Y matrix on the glass substrate 4. Also provided on the glass substrate 4 are the TFTs (Thin Film Transistors) 11 acting as switching elements, and the electric charge storage capacitances (Cs) 12.

The glass substrate 4 is a non-alkaline glass substrate (e.g., #7059 or #1737 available from Corning Inc.). The glass substrate 4 has thereon the gate electrodes 9 and the storage capacitance electrodes (Cs electrodes) 13, both being made of Ta (Tantalum), Al (aluminum) or another metal film.

The gate insulating film 5 made of $SiN_x$, $SiO_x$, or another similar material is provided on a substantial entirety of the glass substrate 4 so as to cover the gate electrodes 9 and the storage capacitance electrodes (Cs electrodes) 13. The gate insulating film 5 performs a dual function as a part of the electric charge storage capacitances (Cs) 12. Not only by the gate insulating film 5 composed of $SiN_x$, $SiO_x$, or another similar material, may the insulation be provided also by an anodized film formed by anodization of the gate electrodes 9 and the electric charge storage capacitance electrodes (Cs electrodes) 13.

An a-Si film (i layer) 14 acting as a channel section for the TFTs 11, and an a-Si film ($n^+$ layer) 15 for establishing contact between the a-Si film (i layer) 14 and the source electrodes 10 and also between the a-Si film (i layer) 14 and the drain electrodes 16 are provided on the gate electrodes 9 with the gate insulating film 5 being interposed.

The source electrodes 10 and the drain electrodes 16 (doubling as Cs electrodes) are composed of Ta, Al, or another similar metal and provided on the a-Si film ($n^+$ layer) 15.

In this manner, the first insulating protection layer 6 is formed of $SiN_x$ on a substantial entirety of the glass substrate 4 on which the TFTs 11 and the electric charge storage capacitances 12 are provided. Then, the second insulating protection layer 7, about 3 μm thick, is formed so as to cover a substantial entirety of the first insulating protection layer 6. The second insulating protection layer 7 is an acrylic resin or another photosensitive, organic insulating film.

The pixel electrodes 8 are formed of ITO (Indium Tin Oxide) on the second insulating protection layer 7. The second insulating protection layer 7 has contact holes 17 in which the pixel electrodes 8 are connected to the drain electrodes 16.

Note that although the TFT element here is a-Si and has an inverted stagger structure, these are not the only possibility. Alternatively, the TFT element may be p-Si and have a stagger structure.

The approximately 0.5 mm to 1 mm thick a-Se photoconductor film 2 is provided on the pixel area of the active matrix substrate 1 fabricated as in the foregoing. The a-Se photoconductor film 2 covers the entire pixel area and those parts of the second insulating protection layer 7 that are exposed along the edges of the pixel area.

The Au (gold) common electrodes 3 are disposed on the photoconductor film 2 so as to cover the pixel area 18 (see FIG. 3). The common electrodes 3 stretch beyond the boundary of the pixel area 18, but only within the confines of the second insulating protection layer 7.

In the two-dimensional image detector of the present embodiment including the foregoing arrangement, as shown in FIG. 3, the second insulating protection layer 7 stretches beyond the boundary of the pixel area 18. In the present embodiment, the second insulating protection layer 7 stretches about 5 mm beyond the boundary of the pixel area 18. The photoconductor film 2, since stretching 1 mm to 10 mm beyond the edges of the second insulating protection layer 7, completely covers the exposed parts of the second insulating protection layer 7.

Now, the following description will discuss a manufacturing method of the two-dimensional image detector in detail.

The active matrix substrate 1 constituting the two-dimensional image detector of the present embodiment can be fabricated by the same process as active matrix substrates in liquid crystal display devices.

In the first step, Ta, Al, or another similar metal is deposited on a non-alkaline glass substrate 4 in a thickness of about 3000 Å by sputtering, and subsequently etched in a desired pattern, so as to form the gate electrodes 9. The storage capacitance electrodes (Cs electrodes) 13 are also etched simultaneously.

In the second step, $SiN_x$, $SiO_x$, or another similar material is deposited in a thickness of about 3500 Å by a CVD technique, so as to provide the gate insulating film 5.

In the third step, a-Si (i layer) and a-Si ($n^+$ layer) are deposited in thicknesses of about 1000 Å and 400 Å respectively by a CVD technique, and subsequently etched into a desired pattern, so as to provide the a-Si film (i layer) 14 and the a-Si film ($n^+$ layer) 15 on the gate electrode 9.

In the fourth step, Ta, Al, or another similar metal is deposited in a thickness of about 3000 Å by sputtering, and subsequently etched into a desired pattern, so as to form the source electrodes 10 and the drain electrodes 16.

In the fifth step, $SiN_x$ is deposited in a thickness of about 3000 Å by a CVD technique and removed partly from predetermined places on the drain electrodes 16 where the contact holes 17 will be formed in a later step, so as to provide the first insulating protection layer 6.

In the sixth step, a photosensitive acrylic resin, for example, is deposited to form an organic insulating film as the second insulating protection layer 7, and subsequently patterned by a photolithography technique, so as to form the contact holes 17 at predetermined places through the second insulating protection layer 7.

In the seventh step, ITO is deposited in a thickness of about 2000 Å by sputtering, and subsequently etched into a desired pattern, so as to form the pixel electrodes 8. A procedure is taken here so that the pixel electrodes 8 are short-circuited to the drain electrodes 16 in the contact holes 17 provided in the second insulating protection layer 7.

An a-Se film is deposited in a thickness of about 0.5 mm to 1 mm on the active matrix substrate 1 fabricated by the above steps by a vacuum deposition technique, so as to provide the photoconductor film 2. Here, the photoconductor film 2 is formed so as to stretch beyond the edges of the second insulating protection layer 7 and thereby completely cover the edges of the second insulating protection layer 7. This process is performed at room temperature.

Then, Au is deposited in a thickness of about 2000 Å by a vacuum deposition technique, so as to provide the common electrodes 3. The Au is deposited on the photoconductor film 2 only within the confines of the second insulating protection layer 7.

The above step completes the fabrication of the base arrangement of the two-dimensional image detector.

The two-dimensional image detector of the present embodiment, as mentioned in the foregoing, is structured so that the a-Se photoconductor film 2 completely covers those parts of the acrylic resin second insulating protection layer 7 that are exposed along the edges of the pixel area 18. Therefore, the structure does not allow the second insulating protection layer 7, which is exposed along the edges of the pixel area 18, to contact ambient air, and thus prevents to a satisfactory extent the acrylic resin from peeling off or deteriorating due to humidity and other adverse effects of ambient air. In addition, the second insulating protection layer 7, although being exposed along the edges of the pixel area 18, is not exposed directly to X-rays. This provides protection to material (in this case, resin) from deterioration due to the direct exposure.

In the two-dimensional image detector of the present embodiment, a voltage as high as a few kilovolts to tens of kilovolts is applied across the common electrodes 3 during the formation of an about 0.5 mm to 1.0 mm thick a-Se film as the photoconductor film 2. The common electrodes 3 are provided only within the confines of the second insulating protection layer 7, and therefore do not exist outside the second insulating protection layer 7. So, no high voltage is applied to the photoconductor film 2, which exists outside the second insulating protection layer 7.

No high voltage is directly applied to the first insulating protection layer 6 on the gate electrodes 9, the source electrodes 10, the electric charge storage capacitances (Cs) 12, etc.; therefore, the insulation provided on the electrode wires can be prevented from breaking down. In other words, the first insulating protection layer 6 can be prevented from being destructed. The generation of parasitic capacitances is also prevented sufficiently in the first insulating protection layer 6, effectively reducing signal noise and improving the reliability of the device.

Figure 4:
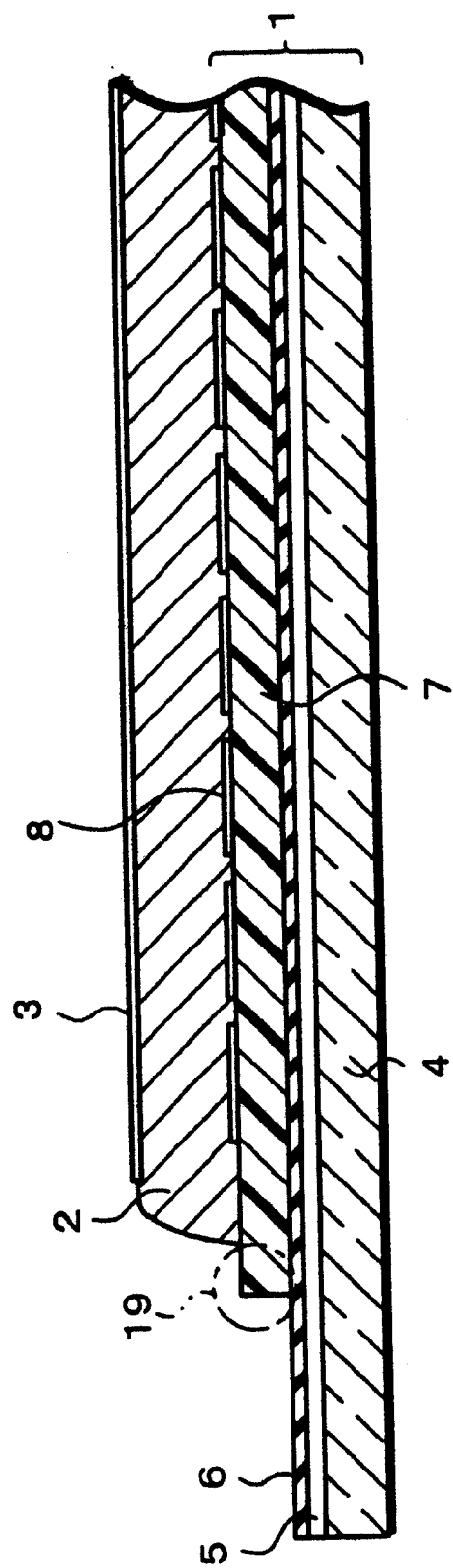
FIG. 4 is a cross-sectional view schematically showing an arrangement of a two-dimensional image detector as a comparative example for the foregoing two-dimensional image detector.

FIG. 4 shows, as a comparative example, an arrangement of a two-dimensional image detector with parts of an acrylic resin film as the second insulating protection layer 7 being exposed along the edges. In this case, the exposed parts 19 of the acrylic resin second insulating protection layer 7 contact ambient air and deteriorate easily.

In the present embodiment, the description has so far dealt with the second insulating protection layer 7 composed of a photosensitive acrylic resin material; however, other resins, photosensitive or not, may be used instead. Any insulating material other than resin may be also used.

[Embodiment 2]

Figure 5:
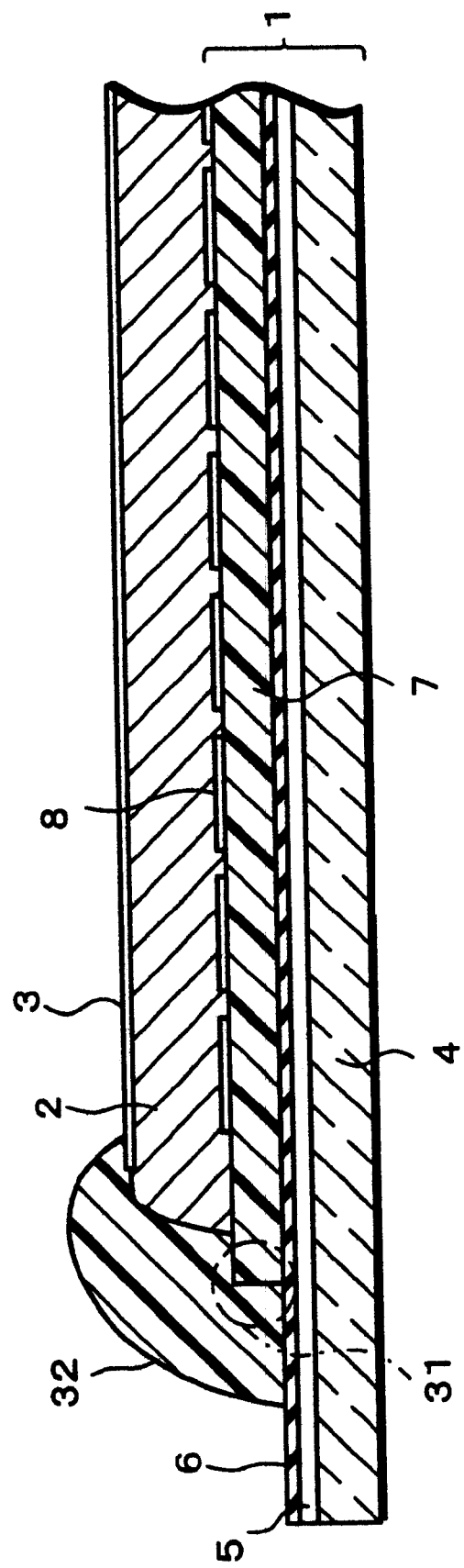
FIG. 5 is a cross-sectional view schematically showing an arrangement of an edge of a two-dimensional image detector in accordance with a second embodiment of the present invention.
Figure 6:
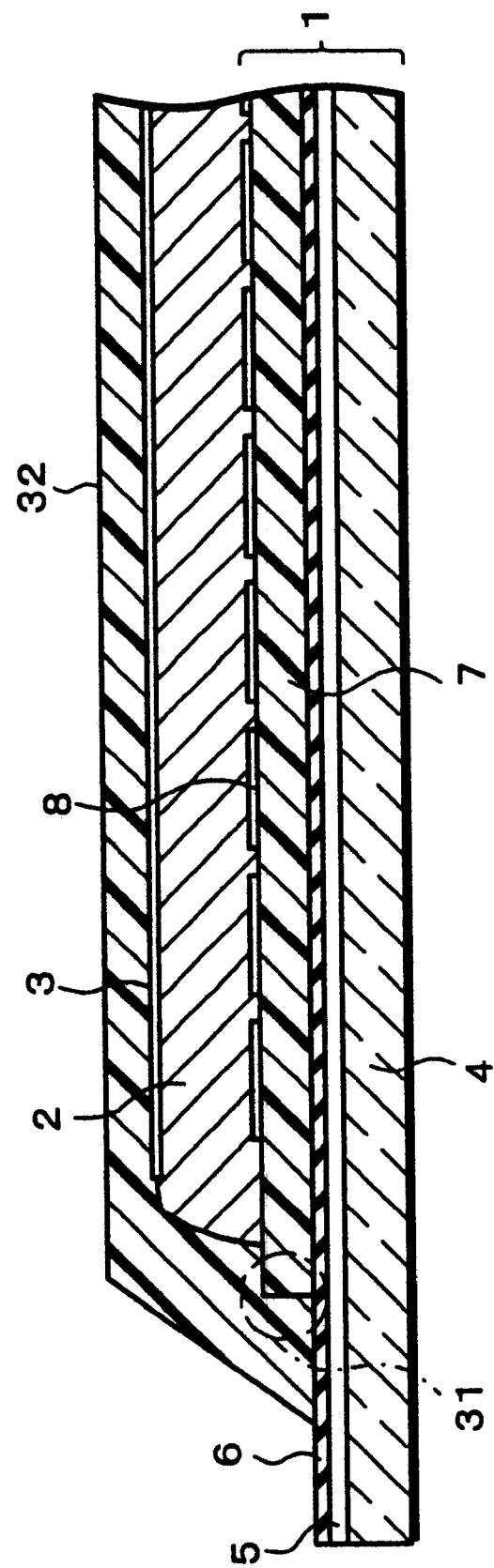
FIG. 6 is a cross-sectional view schematically showing an arrangement of an edge of a two-dimensional image detector which is modified based on the foregoing two-dimensional image detector.

Referring to FIGS. 5 and 6, the following description will discuss a second embodiment in accordance with the present invention. Here, for convenience, members of the present embodiment that have the same arrangement and function as members of the previous embodiment, and that are mentioned in the previous embodiment are indicated by the same reference numerals and description thereof is omitted.

A two-dimensional image detector of the present embodiment has the same base arrangement and manufacturing method as the two-dimensional image detector detailed in embodiment 1, except that the two-dimensional image detector of the present embodiment does not include the structure for the photoconductor film to cover the exposed parts of the second insulating protection layer.

FIG. 5 is a cross-sectional view schematically showing a base arrangement of the two-dimensional image detector of the present embodiment. As shown in FIG. 5, the base portion of the two-dimensional image detector of the present embodiment as a device includes an active matrix substrate 1, as well as a photoconductor film 2 and common electrodes 3 formed on the active matrix substrate 1.

The second insulating protection layer 7 is formed stretching beyond the boundary of the photoconductor film 2; therefore, the edges of the second insulating protection layer 7 are therefore not covered with the photoconductor film 2, which forms exposed parts 31. A third insulating protection layer 32 is formed of an epoxy resin, so as to cover the exposed parts 31. Considering likely deterioration of the material composing the third insulating protection layer 32, the third insulating protection layer 32 preferably is provided stretching sufficiently beyond the edges of the exposed parts 31 of the second insulating protection layer 7. Accordingly, in the present embodiment, the third insulating protection layer 32 is provided completely covering, and stretching about 1 cm beyond, the edges of the exposed parts 31 of the second insulating protection layer 7.

As detailed in the foregoing, in the two-dimensional image detector of the present embodiment, the exposed parts 31 of the acrylic resin second insulating protection layer 7 is completely covered with the epoxy resin third insulating protection layer 32. Therefore, the structure does not allow the exposed parts 31 of the second insulating protection layer 7 to directly contact ambient air and thus prevents to a satisfactory extent the second insulating protection layer 7 from peeling off or deteriorating due to humidity and other adverse effects of ambient air. In addition, for the same reasons, the acrylic resin second insulating protection layer 7 is not exposed directly to X-rays. This provides protection to the resin from deterioration due to the direct exposure.

In the present embodiment, the description has so far dealt with the third insulating protection layer 32 made of an epoxy resin; however, polyimide or another material which provides as much insulation as an epoxy resin may be used.

The third insulating protection layer 32 only needs to completely cover the exposed parts 31 of the second insulating protection layer 7. No limitations are imposed on it regarding the shape and position. For example, as shown in FIG. 6, the third insulating protection layer 32 may be formed on the surface of the device so as to cover the entirety of the common electrodes 3, the photoconductor film 2, and the exposed parts 31 of the second insulating protection layer 7. This covering of the device surface with the third insulating protection layer 32 provides protection to the exposed parts 31 of the second insulating protection layer 7 and prevention of ambient vapor from forming dew drops on the device surface.

Also, the covering of the device surface with the third insulating protection layer 32 provides prevention of surface discharge from happening, despite of the fact that a voltage as high as a few kilovolts to tens of kilovolts is applied across the common electrodes 3 during the operation of the device.

With this arrangement, the third insulating protection layer 32 covers the image detection area, i.e., the area in which the common electrodes 3 are formed; therefore, the third insulating protection layer 32 needs to be composed of a material that allows passage to X-rays. An Epoxy resin, a silicon resin, polyimide, and other similar resins used as material composing the third insulating protection layer 32 of the present embodiment sufficiently allow passage to X-rays and present no problems in such use.

[Embodiment 3]

Figure 7:
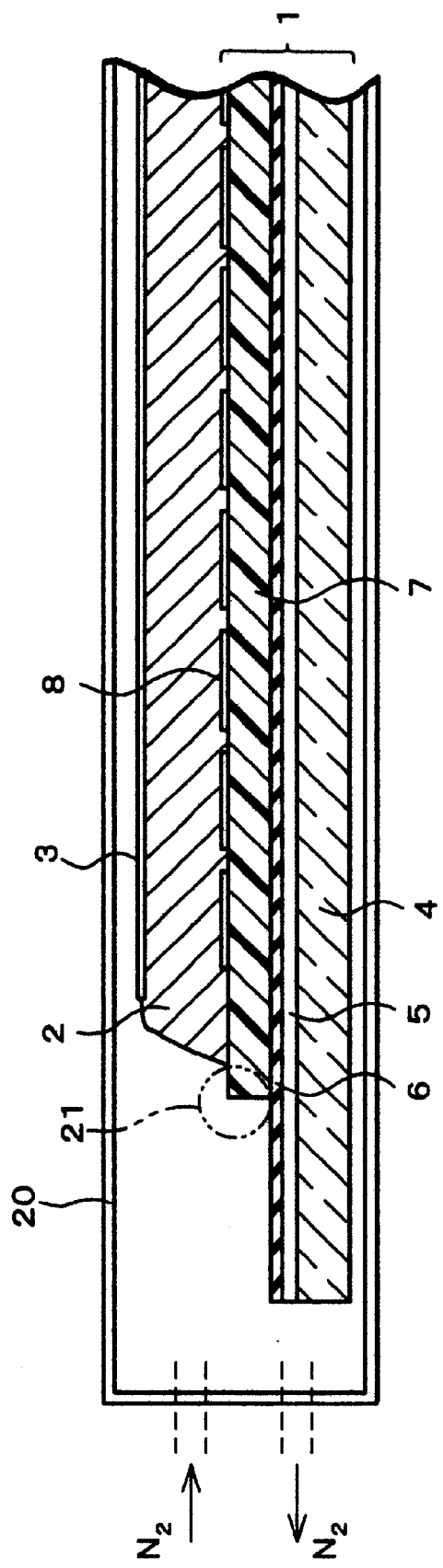
FIG. 7 is a cross-sectional view schematically showing an arrangement of an edge of a two-dimensional image detector in accordance with a third embodiment of the present invention.
Figure 8:
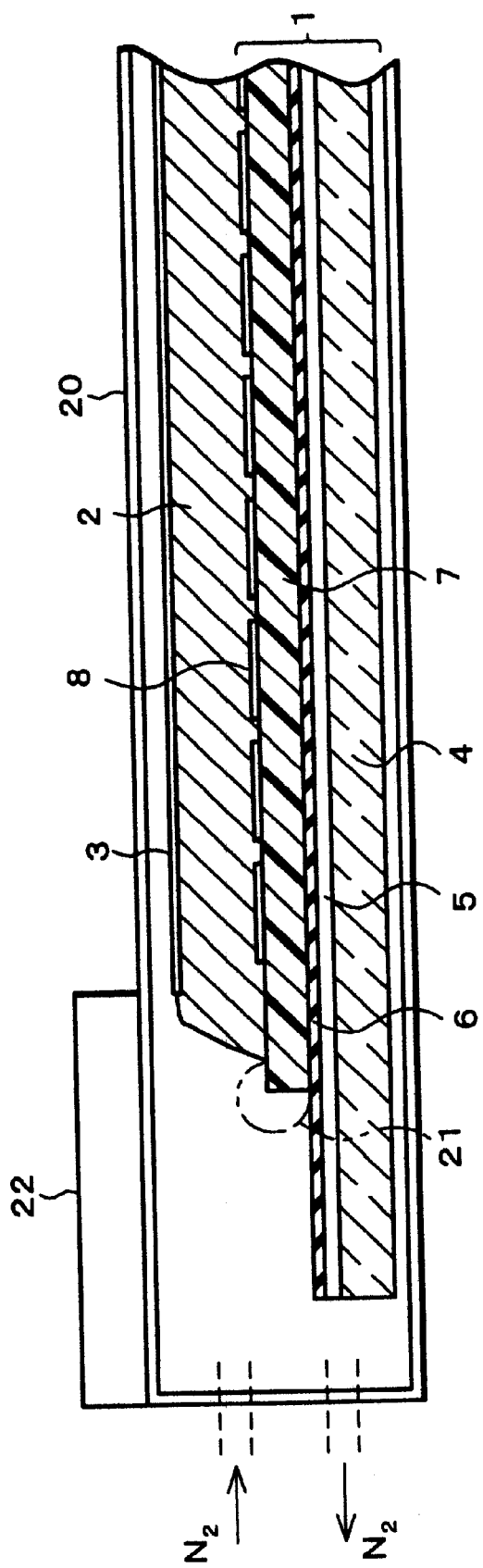
FIG. 8 is a cross-sectional view schematically showing an arrangement of an edge of a two-dimensional image detector which is modified based on the foregoing two-dimensional image detector.
Figure 9:
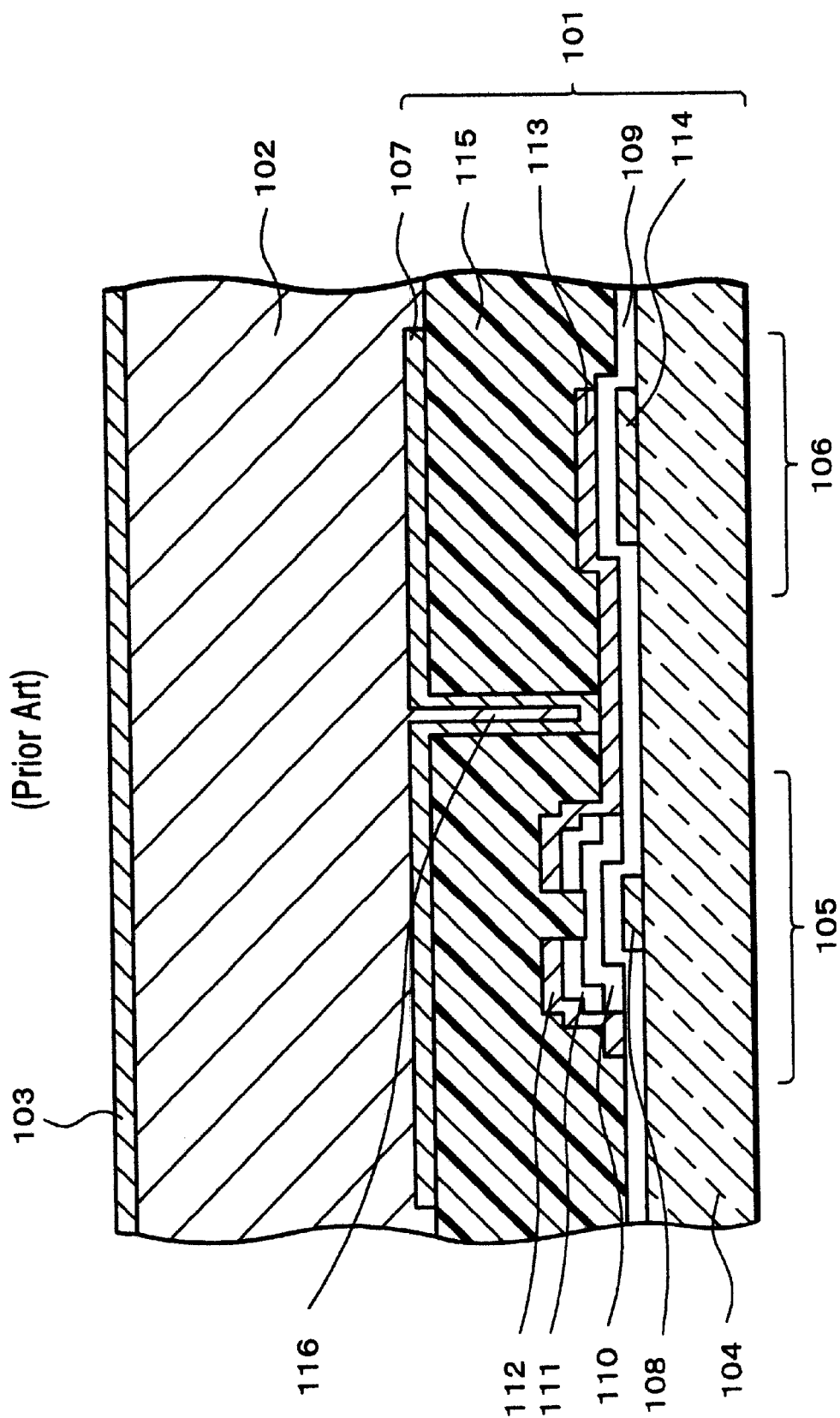
FIG. 9 is a cross-sectional view schematically showing an arrangement of a conventional two-dimensional image detector having a roof structure.

Referring to FIGS. 7 and 8, the following description will discuss a third embodiment of the present invention. Here, for convenience, members of the present embodiment that have the same arrangement and function as members of embodiment 1, and that are mentioned in embodiment 1 are indicated by the same reference numerals and description thereof is omitted.

A two-dimensional image detector of the present embodiment has the same base arrangement and manufacturing method as the two-dimensional image detector detailed in embodiment 1, except that the two-dimensional image detector of the present embodiment does not include the structure for the photoconductor film to cover the exposed parts of the second insulating protection layer.

FIG. 7 is a cross-sectional view schematically showing a base arrangement of the two-dimensional image detector of the present embodiment. As shown in FIG. 7, the base portion of the two-dimensional image detector includes an active matrix substrate 1, as well as an a-Se photoconductor film 2 and a Au common electrode 3 formed on the active matrix substrate 1, and is inserted in a container (shield member) 20 whose internal atmosphere is replaced by $N_2$ (nitrogen) gas. The container 20 is composed of carbon or another material that readily allows passage to X-rays. After inserting the base arrangement of the two-dimensional image detector into the container 20, the internal atmosphere of the container 20 is continuously replaced by $N_2$ gas at a predetermined rate to complete the fabrication of the two-dimensional image detector of the present embodiment.

With the arrangement, the exposed parts 21 of the acrylic resin second insulating protection layer 7 is shielded from external atmosphere by the container 20, and therefore does not contact humid external atmosphere. This provides prevention to the acrylic resin film from peel-off or deterioration due to humidity.

In the present embodiment, the photoconductor film 2 does not cover the exposed parts 21 of the second insulating protection layer 7; however, the exposed parts 21 of the second insulating protection layer may be covered as in embodiment 1. The inner atmosphere may be replaced by, besides $N_2$, Ar (argon) or another inert or dry gas.

Reduction in pressure of the inner atmosphere of the container 20 can also provide a shield to the second insulating protection layer 7 from external atmosphere. The extent of the reduction may vary and be decided as appropriate considering the forces exerted on the device and other factors.

Alternatively, considering that the container 20 is composed of a material that readily allows passage to X-rays, as shown in FIG. 8, an X-ray shield member 22 may be provided on the external surface of the container 20 outside the image detection area, i.e., an area in which no common electrode 3 exists. With the arrangement, the exposed parts 21 of the second insulating protection layer 7 are not exposed directly to X-rays, which provides further protection to the organic insulating film constituting the exposed parts 21 from polymerization, decomposition and other degradation.

The X-ray shield member 22 is made of Ta, Pb (lead), W (tungsten), Ba (barium), or another material that provides highly effective shielding from radiation.

Now, the following description will summarize features of two-dimensional image detectors in accordance with the present invention.

A two-dimensional image detector in accordance with the present invention includes:

an active matrix substrate including a pixel-containing layer constituted by:
electrode wires provided in a matrix on a support substrate;
switching elements located at respective points in the matrix;
electric charge storage capacitances connected respectively to the electrode wires via the switching elements;
an insulating layer provided on the electrode wires, the switching elements, and the electric charge storage capacitances; and
pixel electrodes located at respective points in the matrix on the insulating layer;
a photoconductive semiconductor layer provided on a substantial entirety of the pixel-containing layer; and
an electrode layer provided on a substantial entirety of the semiconductor layer, and
is characterized in that
the semiconductor layer is formed stretching beyond a boundary of the insulating layer so as to cover edges of the insulating layer.

In the arrangement, the two-dimensional image detector in accordance with the present invention may be such that the electrode layer formed stretches only within the confines of the insulating layer.

The two-dimensional image detector in accordance with the present invention may be such that the edges of the insulating layer are covered with a protection film fabricated in a resin or other similar material, instead of that the edges of the insulating layer are covered with a photoconductive layer.

Alternatively, the two-dimensional image detector in accordance with the present invention may include:

an active matrix substrate including a pixel-containing layer constituted by:
electrode wires provided in a matrix on a support substrate;
switching elements located at respective points in the matrix;
electric charge storage capacitances connected respectively to the electrode wires via the switching elements;
an insulating layer provided on the electrode wires, the switching elements, and the electric charge storage capacitance; and
pixel electrodes located at respective points in the matrix on the insulating layer;
a photoconductive semiconductor layer provided on a substantial entirety of the pixel-containing layer; and
an electrode layer provided on a substantial entirety of the semiconductor layer, and
is characterized in that
a part of the two-dimensional image detector constituted by the active matrix substrate, the semiconductor layer, and the electrode layer is shielded from external atmosphere.

In the arrangement, the two-dimensional image detector in accordance with the present invention may be such that the foregoing part of the two-dimensional image detector constituted by the active matrix substrate, the semiconductor layer, and the electrode layer is maintained in either one of inert gas, dry gas, and depressurized atmospheres so as to be shielded from external atmosphere.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A two-dimensional image detector, comprising:
an active matrix substrate including pixel electrodes provided on an insulating layer provided in turn on:
electrode wires arranged in a matrix;
switching elements located at respective points in the matrix; and electric charge storage capacitances connected respectively to the electrode wires via the switching elements;

a photoconductive semiconductor layer disposed on the active matrix substrate; and a protection film provided so as to cover edges of the insulating layer.

2. The two-dimensional image detector as set forth in claim 1, wherein the semiconductor layer doubles as the protection film.

3. The two-dimensional image detector as set forth in claim 1, further comprising an electrode layer stretching on the semiconductor layer only within confines of the insulating layer.

4. The two-dimensional image detector as set forth in claim 2, further comprising an electrode layer stretching on the semiconductor layer only within confines of the insulating layer.

5. The two-dimensional image detector as set forth in claim 1, wherein the protection film is composed of a resin.

6. The two-dimensional image detector as set forth in claim 3, wherein the protection film is provided so as to cover every exposed part of the insulating layer, the semiconductor layer, and the electrode layer.

7. The two-dimensional image detector as set forth in claim 6, wherein the protection film is composed of a material allowing passage to radiation.

8. The two-dimensional image detector as set forth in claim 1, wherein the insulating layer is composed of a resin.

9. A two-dimensional image detector, comprising:

an active matrix substrate including pixel electrodes provided on an insulating layer provided in turn on:
  electrode wires arranged in a matrix;
  switching elements located at respective points in the matrix; and
  electric charge storage capacitances connected respectively to the electrode wires via the switching elements; and a shield member for shielding the insulating layer from external atmosphere.

10. The two-dimensional image detector as set forth in claim 9, wherein the shield member maintains the insulating layer in an inert gas atmosphere so as to provide shield to the insulating layer from external atmosphere.

11. The two-dimensional image detector as set forth in claim 9, wherein the shield member maintains the insulating layer in a dry gas atmosphere so as to provide shield to the insulating layer from external atmosphere.

12. The two-dimensional image detector as set forth in claim 9, wherein the shield member maintains the insulating layer in a depressurized atmosphere so as to provide shield to the insulating layer from external atmosphere.

13. The two-dimensional image detector as set-forth in claim 9, wherein the insulating layer is composed of a resin.

14. The two-dimensional image detector as set forth in claim 9, further comprising a protection film provided so as to cover edges of the insulating layer.

15. The two-dimensional image detector as set forth in claim 14, further comprising a photoconductive semiconductor layer on the active matrix substrate, wherein the semiconductor layer doubles as the protection film.

16. The two-dimensional image detector as set forth in claim 9, wherein the shield member is a container accommodating therein an entirety of the active matrix substrate and a photoconductive semiconductor layer provided on the active matrix substrate.

17. The two-dimensional image detector as set forth in claim 16, wherein the shield member is composed of a material allowing passage to radiation.

18. The two-dimensional image detector as set forth in claim 17; wherein a radiation blocking member is provided on an external surface of the shield member on edges of the insulating layer.

* * * * *